(12) United States Patent
Shimizu et al.

(10) Patent No.: US 8,000,403 B2
(45) Date of Patent: Aug. 16, 2011

(54) CODING DEVICE, DECODING DEVICE, TRANSMITTER AND RECEIVER

(75) Inventors: Masahiko Shimizu, Kawasaki (JP); Akira Ito, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 866 days.

(21) Appl. No.: 11/987,335

(22) Filed: Nov. 29, 2007

(65) Prior Publication Data
US 2008/0130784 A1    Jun. 5, 2008

(30) Foreign Application Priority Data
Nov. 30, 2006 (JP) ................................. 2006-323436

(51) Int. Cl.
*H04L 5/12* (2006.01)
*H04L 23/02* (2006.01)
(52) U.S. Cl. ........ 375/262; 375/341; 375/265; 714/794; 714/795
(58) Field of Classification Search .................. 375/262, 375/265, 261, 264, 340, 341; 714/794, 795
See application file for complete search history.

(56) References Cited

U.S. PATENT DOCUMENTS

| | | | |
|---|---|---|---|
| 6,807,238 B1 | 10/2004 | Rhee et al. | |
| 7,391,826 B2 * | 6/2008 | Claussen et al. | 375/340 |
| 2001/0010710 A1 | 8/2001 | Kim | |
| 2003/0110436 A1 | 6/2003 | Von Elbwart et al. | |
| 2004/0221219 A1 | 11/2004 | Von Elbwart et al. | |
| 2005/0022101 A1 | 1/2005 | Malm et al. | |
| 2005/0102600 A1 | 5/2005 | Anandakumar | |
| 2006/0251185 A1 | 11/2006 | Von Elbwart et al. | |

FOREIGN PATENT DOCUMENTS

| | | |
|---|---|---|
| EP | 1 119 109 A1 | 7/2001 |
| EP | 1 313 247 A1 | 5/2003 |
| EP | 1 571 774 A2 | 9/2005 |
| EP | 1 340 331 B1 | 1/2007 |
| JP | 2002-135134 | 5/2002 |
| JP | 2004-523938 | 8/2004 |

OTHER PUBLICATIONS

Communication/ Partial European Search Report from the European Patent Office dated Jan. 5, 2009 issued in the Corresponding European Patent Application 07121836.6-2223.
Mark Bingeman and Amir K. Khandani, "Symbol-Based Turbo Codes", IEEE Communications Letters, vol. 3, No. 10; Oct. 1999p. 285-287.

* cited by examiner

*Primary Examiner* — Phuong Phu
(74) *Attorney, Agent, or Firm* — Murphy & King, P.C.

(57) ABSTRACT

A coding device including a coding unit generating a systematic bit, a first redundant bit corresponding to the systematic bit, and a second redundant bit corresponding to the systematic bit, has a generating unit generating, from the two pieces of systematic bits, the two pieces of first parity bits corresponding to the systematic bits and the two pieces of second redundant bits corresponding to the systematic bits, a tuple of one systematic bit and the first redundant bit corresponding to one systematic bit, a tuple of the other systematic bit and the first redundant bit corresponding to the other redundant bit, and a tuple of the second redundant bit corresponding to one systematic bit and the second redundant bit corresponding to the other systematic bit.

8 Claims, 22 Drawing Sheets

Sm: m-TH SYSTEMATIC BIT
P1m: m-TH FIRST PARITY BIT
P2m: m-TH SECOND PARITY BIT

Sm: m-TH SYSTEMATIC BIT
P1m: m-TH FIRST PARITY BIT
P2m: m-TH SECOND PARITY BIT

FIG. 13

| | BIT BASIS (CONVENTIONAL EXAMPLE 1) | SYMBOL BASIS (CONVENTIONAL EXAMPLE 2) | TURBO DECODING 1 | TURBO DECODING 2 |
|---|---|---|---|---|
| CHARACTERISTICS (IMPROVEMENT OF REQUIRED SNR) | 0 dB | IMPROVEMENT OF 0.5 dB | IMPROVEMENT OF 0.4 dB | IMPROVEMENT OF 0.3 dB |
| THROUGHPUT (NUMBER PER STAGE) | 1 | 2 | 1.5 | 1 |

FIG. 16

| | PROBABILITY AFTER SEPARATING AND SYNTHESIZING BITS | ORIGINAL PROBABILITY |
|---|---|---|
| PROBABILITY OF (1, 1) | 0.0375 | 0.05 |
| PROBABILITY OF (1, 0) | 0.1125 | 0.10 |
| PROBABILITY OF (0, 0) | 0.6375 | 0.65 |
| PROBABILITY OF (0, 1) | 0.2125 | 0.20 |

Sm: m-TH SYSTEMATIC BIT
P1m: m-TH FIRST PARITY BIT
P2m: m-TH SECOND PARITY BIT 1-path static

CODING DEVICE, DECODING DEVICE, TRANSMITTER AND RECEIVER

This application claims the benefit of Japanese Patent Application No. JP2006-323436 filed on Nov. 30, 2006 in the Japanese Patent Office, the disclosure of which is herein incorporated in its entirety by reference.

FIELD OF THE INVENTION

The present invention relates to a transmitting/receiving method in a wireless communication system using a multi-valued modulation system by performing turbo coding.

DESCRIPTION OF THE RELATED ART

In the case of employing the multivalued modulation, when obtaining a likelihood of each bit from a reception signal, it follows that bit-to-bit correlation information might be ignored. As illustrated in FIG. 14, in the case of receiving signals of 16-QAM (16 Quadrature Amplitude Modulation), probabilities ($P_{1,1}$, $P_{1,0}$, $P_{0,0}$, $P_{0,1}$) that data patterns of an I (In-phase) ch are (1, 1), (1, 0), (0, 0), (0, 1) become respectively 0.05, 0.10, 0.65, 0.20 as illustrated in FIG. 15. When separating these probabilities into probabilities of the respective bits (MSB (Most Significant Bit) and LSB (Least Significant Bit)), the probabilities are given as follows.

MSB: 0's probability $P_{M,0}=(P_{0,0}+P_{0,1})=0.85$
MSB: 1's probability $P_{M,1}=(P_{1,0}+P_{1,1})=0.15$
LSB: 0's probability $P_{L,0}=(P_{0,0}+P_{1,0})=0.75$
LSB: 1's probability $P_{L,1}=(P_{0,1}+P_{1,1})=0.25$ When further synthesizing these probabilities, as illustrated in FIG. 16, the probabilities that the data patterns of the Ich (In-phase channel) signals are (1, 1), (1, 0), (0, 0), (0, 1) are acquired as below.

$P_{1,1}'=P_{M,1} \times P_{L,1}=0.0375$ $P_{1,0}'=P_{M,1} \times P_{L,0}=0.1125$ $P_{0,0}'=P_{M,0} \times P_{L,0}=0.6375$ $P_{0,1}'=P_{M,0} \times P_{L,1}=0.2175$ These probabilities are not coincident with original probabilities. This implies a loss of the bit-to-bit correlation information due to the separation into the respective bits. An error correction code such as a convolution code and a turbo code functions as a bit sequence containing redundant bits, and hence deterioration of the characteristics is brought about due to separating the signal into the bits. It is desirable for preventing the deterioration of the characteristics that in the case of 16-QAM, the signal is transmitted on a 2-bit-by-2-bit basis and is processed on the 2-bit-by-2-bit basis.

A coding method on a symbol basis is proposed for preventing the loss of the correlation information due to the coding on the bit basis described above. The processing on the symbol basis eliminates a necessity of separating the signal into the bits. As shown in FIG. 17, in the case of using 16-QAM and the turbo code, two pieces of systematic bits, two pieces of first parity bits and two pieces of second parity bits are mapped to an I (In-phase) component and a Q (Quadrature) component of the same symbol, thereby becoming the turbo code on the symbol basis.

As illustrated in FIG. 18, generally the turbo code takes a structure of subtracting a likelihood of the systematic bit from an output of MAP (Maximum A Posteriori Probability), and it is therefore desirable that the systematic bit and the parity bit be independent. Further, a MAP process is executed separately for each parity bit, and hence it is better that the first parity bit and the second parity bit be independent. Accordingly, a scheme is that the two pieces of systematic bits, the two pieces of first parity bits and the two pieces of second parity bits are each treated as one aggregation. Further, interleaving is conducted in a way that treats the 2 bits as one aggregation.

FIG. 19 is a diagram showing a characteristic in the case of using the turbo coding on the symbol basis. When the turbo coding is carried out on the bit basis while the interleaving is conducted on the symbol basis (actually, on an I-component basis or a Q-component basis of the symbol) (FIG. 19: 1 bit), as compared with such a case that the turbo decoding is performed on the bit basis while the interleaving is conducted on the bit basis (FIG. 19: 1-bit, S-P pair), the characteristic is deteriorated. This is because an acceptable level of correlation between the first parity bit and the second parity bit is obtained owing to the interleaving on the symbol basis, resulting in being weakened against noises. If the turbo coding is executed on the symbol basis while the interleaving is conducted on the symbol basis (FIG. 19: 2-bit), however, the higher acceptable characteristic is acquired than the characteristic in the case of executing the turbo decoding on the bit basis and conducting the interleaving on the bit basis (FIG. 19: 1-bit, S-P pair).

[Patent document 1] Japanese Unexamined Patent Publication No. 2004-523938

[Patent document 2] Japanese Patent Application Laid-Open Publication No. 2002-135134

[Non-Patent document 1] Mark Bingeman and Amir K. Khandani, "Symbol-Based Turbo Codes", IEEE COMMUNICATIONS LETTERS, VOL. 3, NO. 10, October 1999, PP. 285-287.

SUMMARY OF THE INVENTION

As in FIG. 20, in the case of the turbo coding on the bit basis, the MAP compares the patterns at every stage in a decoding algorithm. Therefore, it is enough that the MAP may be stored with two-ways of patterns. As in FIG. 21, however, in the case of the turbo coding on the symbol basis, in the decoding algorithm, the MAP compares the patterns at every 2 stages. It is because the systematic bits and the first parity bits (or the second parity bits) corresponding therefore extend over the 2 stage. Hence, the one-time comparisons between $4(=2^2)$ ways of patterns entail storing 2-fold patterns as compared with the turbo coding (FIG. 20) on the bit basis. In the case of more of the multivalued numbers, a should-be-stored pattern count rises exponentially. As in FIG. 22, for example, in the case of 256-QAM, 4 bits are organized into one aggregation both in the I-component and in the Q-component, and it follows that $16(=2^4)$ ways of patterns are compared and stored. Hence, the turbo coding on the symbol basis with more of the multivalued numbers requires a memory having an extremely large capacity.

The present invention aims at providing a turbo coding device and a turbo decoding device each exhibiting highly acceptable characteristics by saving a memory usage quantity.

The present invention adopts the following means in order to solve the problems.

Namely, the present invention is a coding device including a coding unit generating a systematic bit, a first redundant bit corresponding to the systematic bit, and a second redundant bit corresponding to the systematic bit, the coding device comprising:

a generating unit generating, from the two pieces of systematic bits, the two pieces of first parity bits corresponding to the systematic bits and the two pieces of second redundant bits corresponding to the systematic bits, a tuple of one systematic bit and the first redundant bit corresponding to one systematic bit, a tuple of the other systematic bit and the first redundant bit corresponding to the other redundant bit, and a tuple of the second redundant bit corresponding to one systematic bit and the second redundant bit corresponding to the other systematic bit.

According to the present invention, the systematic bit and the redundant bit corresponding thereto can be allocated to the same tuple.

Further, the present invention is a coding including a coding unit generating a systematic bit, a first redundant bit corresponding to the systematic bit, and a second redundant bit corresponding to the systematic bit, the coding device comprising:

a generating unit generating, from the 2n-pieces of systematic bits, the 2n-pieces of first redundant bits and the 2n-pieces of second redundant bits, a tuple of arbitrary n-pieces of systematic bits and the n-pieces of first redundant bits corresponding to the arbitrary n-pieces of systematic bits, a tuple of the n-pieces of systematic bits other than the arbitrary n-pieces of systematic bits and the n-pieces of first redundant bits corresponding to the n-pieces of systematic bits other than the arbitrary n-pieces of systematic bits, and a tuple of the 2n-pieces of second redundant bits.

According to the present invention, the n-pieces of systematic bits in the 2n-pieces of systematic bits can be allocated to the same tuple.

Yet Further, the present invention is a decoding device to which 2 tuples of systematic bits and first redundant bits corresponding to the systematic bits and a tuple of second redundant bits corresponding to the respective systematic bits of the 2 tuples of bits, are inputted, the decoding device comprising:

a calculating unit calculating a likelihood on a tuple-by-tuple basis;

a first decoding unit performing decoding for every one systematic bit by use of a likelihood of a tuple of the systematic bit and a first redundant bit corresponding to the systematic bit; and a second decoding unit performing decoding for every two systematic bits by use of a likelihood of the systematic bit which is output by the first decoding unit and a likelihood of a tuple of second redundant bits corresponding to the systematic bits.

According to the present invention, the decoding can be done by use of the tuples generated by the coding device of the present invention intact as the tuples.

Therefore, according to the present invention, the decoding with the highly acceptable characteristics can be realized with a less memory usage quantity.

The redundant bits according to the present invention include the parity bits.

EFFECTS OF THE INVENTION

According to the present invention, it is feasible to provide the turbo coding device and the turbo decoding device each exhibiting the highly acceptable characteristics by saving the memory usage quantity.

BEST MODE OF CARRYING OUT THE INVENTION

An embodiment of the present invention will hereinafter be described with reference to the drawings. A configuration in the following embodiment is an exemplification, and the present invention is not limited to the configuration in the embodiment.

Herein, mainly 16-QAM (Quadrature Amplitude Modulation) and 256-QAM are taken up, however, other multivalued modulation systems can be also applied.

BRIEF DESCRIPTION OF THE DRAWINGS

FIG. 13 is a diagram showing effects in a way that sorts out the effects.

FIG. 16 is a diagram showing a probability after separation-synthesizing the bits, and an original probability.

DETAILED DESCRIPTION OF THE INVENTION

<System Architecture>

Figure 1:
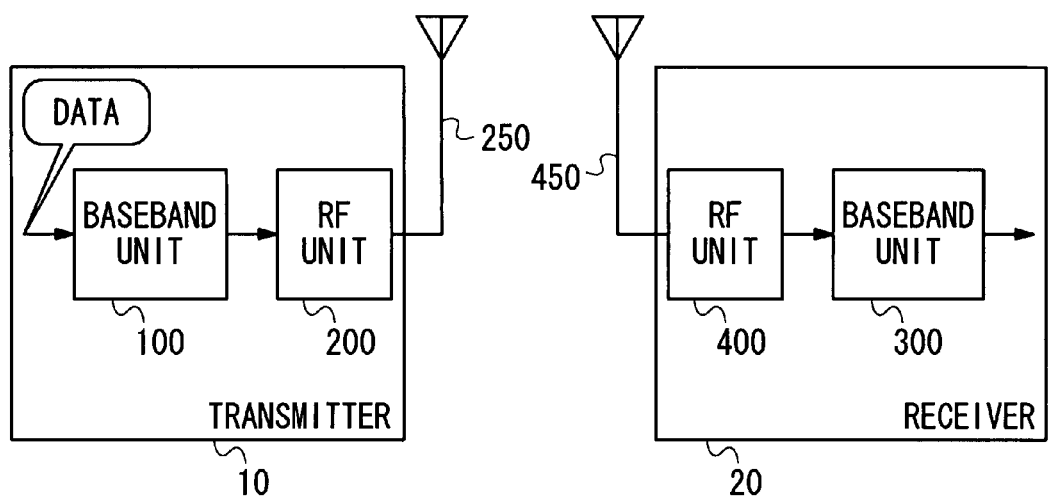
FIG. 1 is a diagram showing examples of a transmitter and a receiver.

FIG. 1 illustrates an example of configurations of a receiver and of a transmitter in an embodiment. A transmitter 10 includes a baseband unit 100 that codes input data, an RF (Radio Frequency) unit 200 that up-converts transmission data from the baseband unit 100 into a radio frequency, and a transmitting antennal 250. A receiver 20 includes a receiving antenna 450, an RF unit 400 that down-converts the received signal from the radio frequency, and a baseband unit 300 that decodes the reception signal from the RF unit 400.

<Transmitter>

Figure 2:
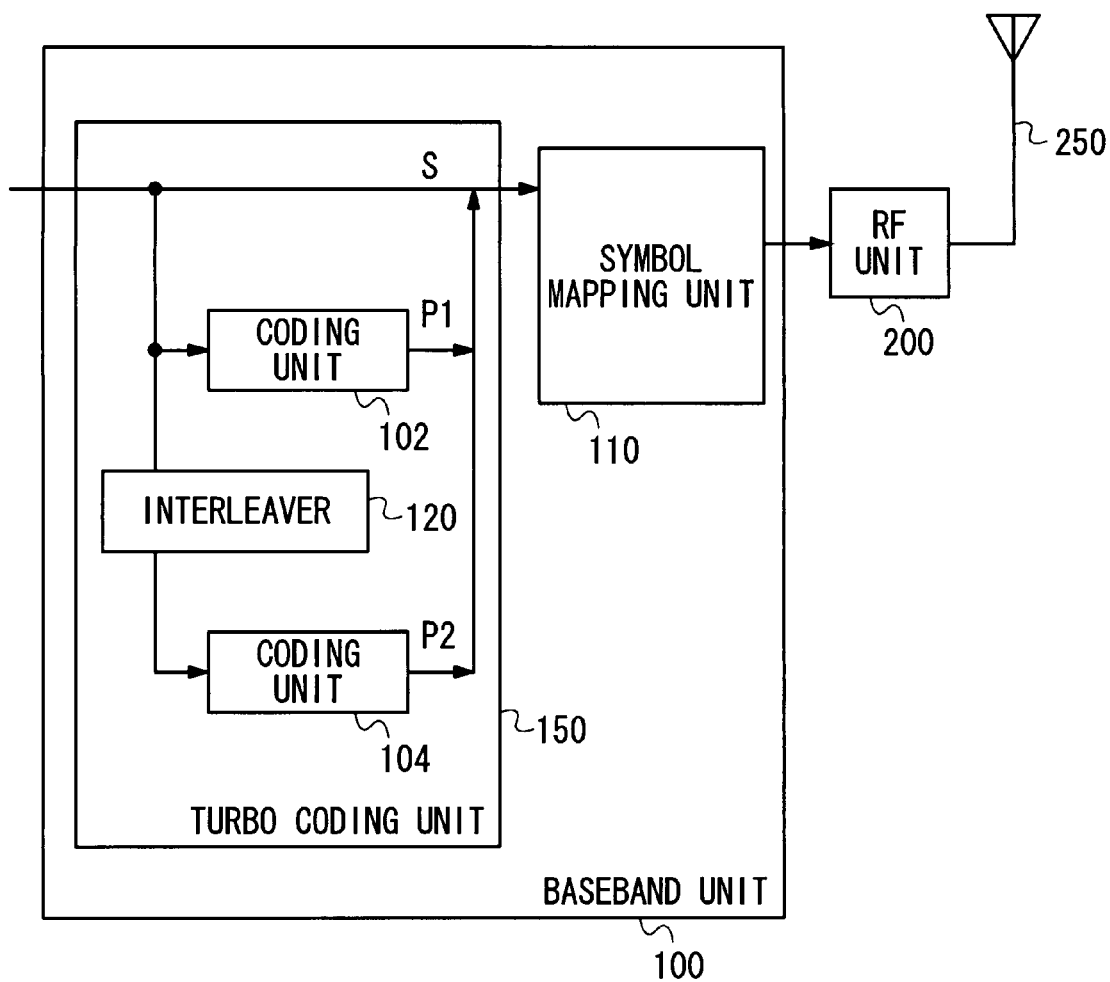
FIG. 2 is a diagram showing an example of a configuration of the transmitter.

FIG. 2 is a diagram showing an in-depth illustration of the baseband unit 100 of the transmitter. The baseband unit 100 includes a turbo coding unit 150 and a symbol mapping unit 110. The turbo coding unit 150 includes two coding units 102, 104 and an interleaver 120.

When inputting data that is to be transmitted to the baseband unit 100 of the transmitter 10, the turbo coding unit 150 outputs pieces of coded data S, P1, P2. The coded data S (a systematic bit) is the inputted data itself. The coded data P1 (a first parity bit) is the data into which the inputted data is convolution-coded by a coder 102. The coded data P2 (a second parity bit) is the data into which the inputted data is interleaved by the interleaver 120 and then convolution-coded by a coder 104. These pieces of coded data S, P1, P2 are synthesized into a turbo code. The interleaver 120 performs interleaving on a bit basis.

The turbo-coded data is inputted to the symbol mapping unit 110. The symbol mapping unit 110 maps a turbo-coded signal train to the 16-QAM.

Figure 3:
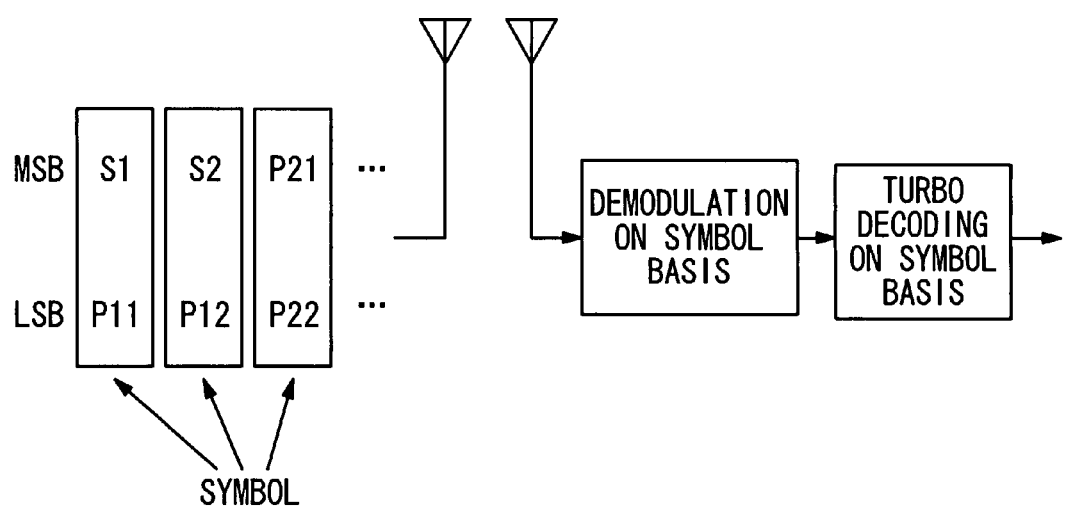
FIG. 3 is a diagram showing an example of mapping a systematic bit and a first parity bit corresponding thereto to one symbol of 16-QAM.

As illustrated in FIG. 3, an assumption is that a signal train consisting of the systematic bits (S1, S2), the first parity bits (P11, P12) and the second parity bits (P21, P22) is inputted. The symbol mapping unit 110 organizes the systematic bits S and the first parity bits P1 into tuple bits (a tuple of S1, P11, and a tuple of S2, P12), and maps the tuple bits to a bit of MSB (most significant bit) and a bit of LSB (least significant bit) of I-component or Q-component of the respective symbols. Further, the symbol mapping unit 110 organizes two remaining pieces of second parity bits into the tuple bits (P21, P22), and maps the tuple bits to the MSB and the LSB.

Note that such a scheme is available that the systematic bits and the second parity bits are organized into the tuple bits and two remaining pieces of first parity bits are organized into the tuple bits. A further available scheme is that the bits mapped to the LSB and the bits mapped to the MSB are replaced with each other.

Figure 4:
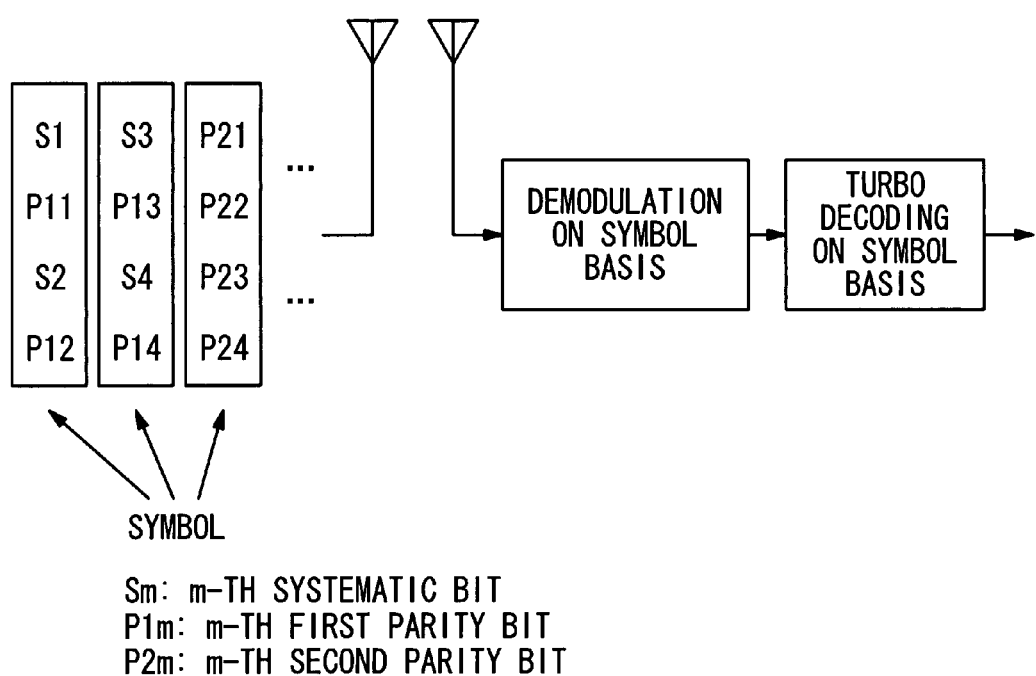
FIG. 4 is a diagram showing an example of mapping the systematic bit and the first parity bit corresponding thereto to one symbol of 256-QAM.

FIG. 4 shows an example of symbol mapping in 256-QAM. According to 256-QAM, one symbol consists of 4 bits. Hence, the data for four systematic bits can be transmitted with three symbols (which are actually the I-components or the Q-components of the symbols). Then, in the same way as in the case of 16-QAM, the symbol mapping unit 110 maps, to the first symbol, the systematic bits (S1, S2) and the first parity bits (P11, P12) corresponding to these systematic bits. The symbol mapping unit 110 maps, to the second symbol, the systematic bits (S3, S4) and the first parity bits (P13, P14) corresponding to these systematic bits. The symbol mapping unit 110 maps the second parity bits (P21, P22, P23, P24) to the third symbol. Further, in the case of multivalued modulation using large numerical values, the mapping can be similarly done.

The transmission data generated by the baseband unit 100 of the transmitter 10 is output to the RF unit 200. The transmission data is up-converted into the radio frequency by the RF unit 200 and transmitted from the transmitting antenna 250.

<Receiver>

As illustrated in FIG. 1, the receiver 20 includes the receiving antenna 450, an RF unit 400 that down-converts the received signal from the radio frequency, and a baseband unit 300 that decodes the reception data sent from the RF unit 400.

Figure 5:
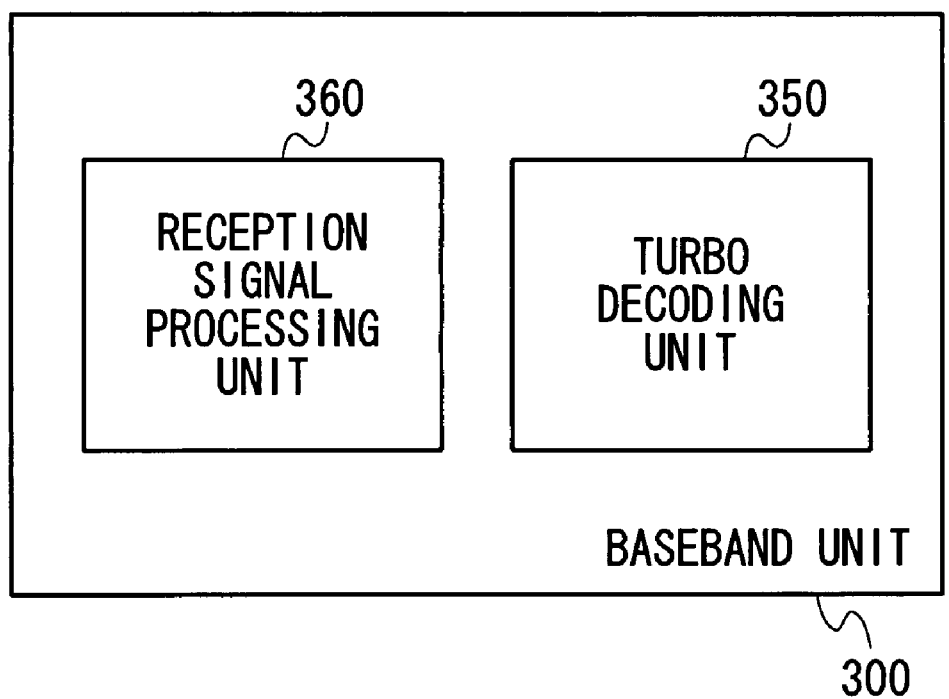
FIG. 5 is a diagram showing an example of a configuration of a baseband signal processing unit of the receiver.

FIG. 5 is a diagram showing an example of a configuration of the baseband unit 300 of the receiver 20. The baseband unit 300 of the receiver 20 includes a reception signal processing unit 360 that calculates a likelihood and a turbo decoding unit 350.

The transmission signal transmitted from the transmitter 10 is received by the receiving antenna 450 of the receiver 20. The reception signal received by the receiving antenna 450 is down-converted by the RF unit 400. The reception data processed by the RF unit 400 is inputted to the baseband unit 300.

<<Calculation of Likelihood at Signal Point>>

Figure 6:
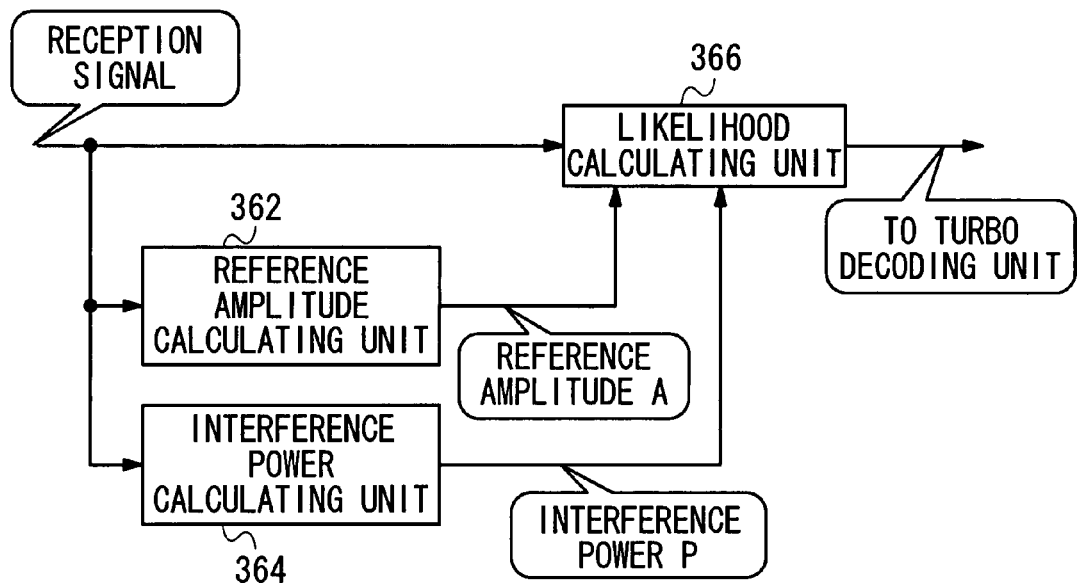
FIG. 6 is a diagram showing a reception signal processing unit.

FIG. 6 is a diagram illustrating an example of a configuration of the reception signal processing unit 360 of the baseband unit 300 of the receiver 20. The reception signal processing unit 360 includes a reference amplitude calculating unit 362 that calculates a reference amplitude of the reception signal, an interference power calculating unit 364 that calculates interference power of the reception signal, and a likelihood calculating unit 366 that calculates a likelihood from the reception signal, the reference amplitude and the interference power.

The reception signal is inputted to the reference amplitude calculating unit 362, wherein a reference amplitude A is calculated. The calculated reference amplitude A is inputted to the likelihood calculating unit 366. Further, the reception signal is inputted to the interference power calculating unit 364, in which interference power P is calculated. The calculated interference power P is inputted to the likelihood calculating unit 366.

Figure 7:
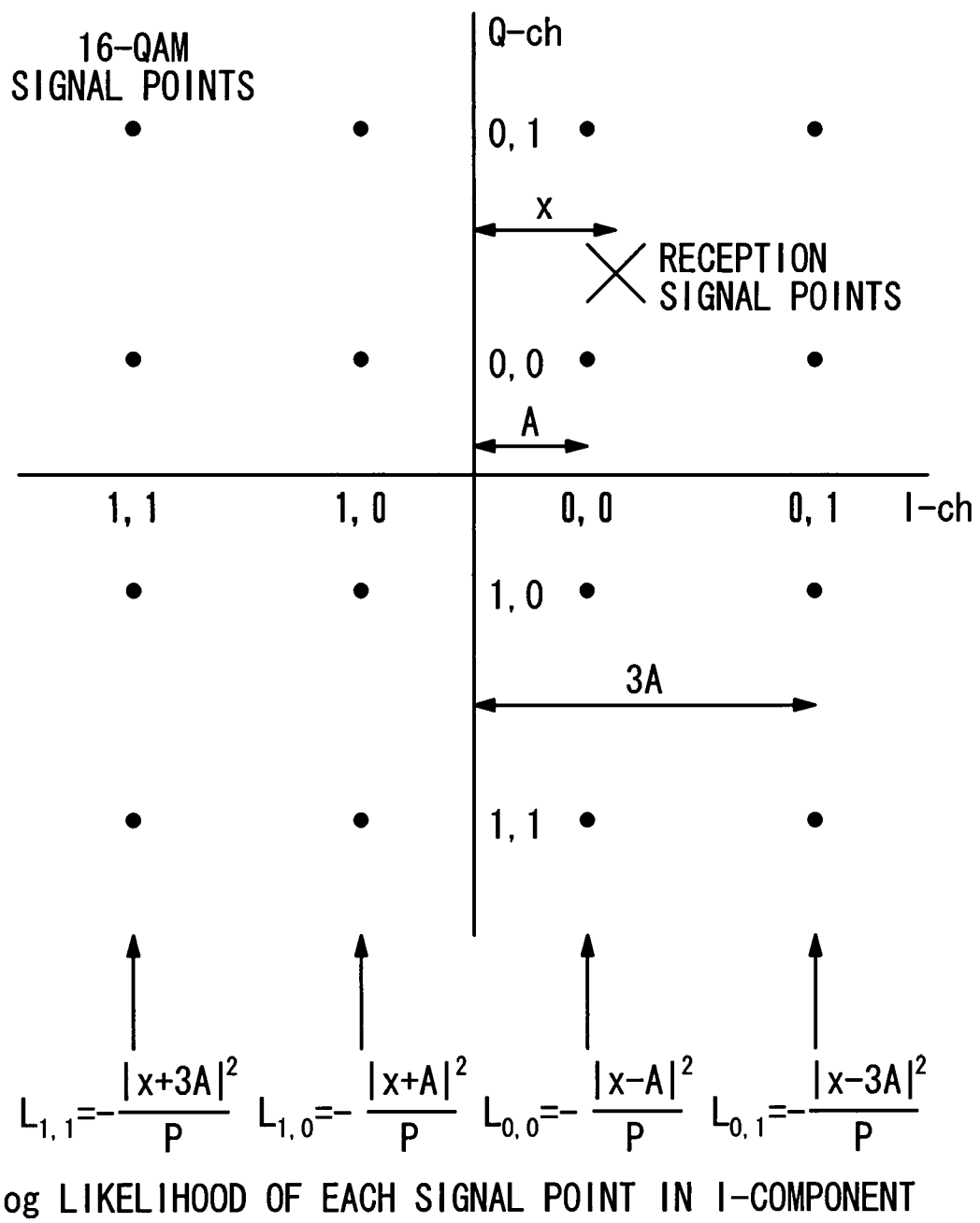
FIG. 7 is a diagram showing a demodulation example of making none of separation on a bit-by-bit basis in 16-QAM.

FIG. 7 is a diagram showing a relation between a reception signal point and each signal point of 16-QAM, and a log likelihood of the I-component at each signal point.

The likelihood calculating unit 366 calculates a log likelihood L at each signal point from the reception signal, the reference amplitude A and the interference power P. The log likelihood L is obtained as below from a ratio of a square of a distance between the reception signal point and each signal point of 16-QAM on axes of the respective components to the interference power P.

$$L_{0,0} = -\frac{|x - A|^2}{P} \quad \text{[Mathematical Expression 1]}$$

$$L_{0,1} = -\frac{|x - 3A|^2}{P} \quad \text{[Mathematical Expression 2]}$$

$$L_{1,0} = -\frac{|x + A|^2}{P} \quad \text{[Mathematical Expression 3]}$$

$$L_{1,1} = -\frac{|x + 3A|^2}{P} \quad \text{[Mathematical Expression 4]}$$

These values are the log likelihoods L of I-component. Herein, x represents the I-component at the reception signal point. Suffixes attached to the letter "L" represent values of MSB and LSB. For example, $L_{1,0}$ represents the log likelihood when MSB is 1 and LSB is 0. The log likelihood becomes smaller at the signal point having a distance farther from the reception signal point.

With this scheme, the obtainable likelihoods of (0, 0), (0, 1), (1, 0), (1, 1) corresponding to the reception signals are acquired in a way that treats the I-components or the Q-components of the 16-QAM symbols as one aggregation. The acquired log likelihood L is inputted to and decoded by the turbo decoding unit 350.

<<Turbo Decoding>>

Figure 8:
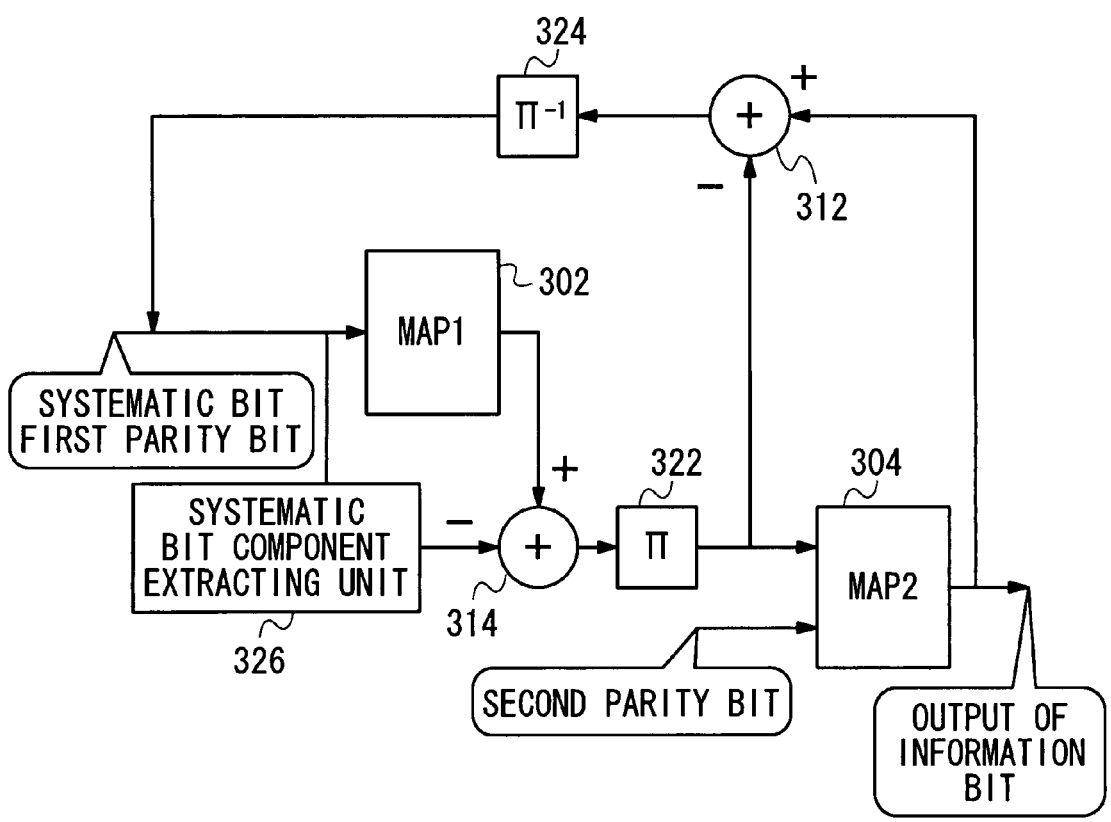
FIG. 8 is a diagram showing an example of a turbo decoding unit.

FIG. 8 is a diagram illustrating the turbo decoding unit 350 of the baseband unit 300 of the receiver 20. The turbo decoding unit 350 includes two MAPs 302, 304 (MAP units), adding units 312, 314, an interleaver 322, a deinterleaver 324 and a systematic bit component extracting unit 326.

As illustrated in FIG. 3, the tuple bits consisting of the systematic bit and the first parity bit and another tuple of bits consisting of the two pieces of second parity bits are mapped to the symbols, and hence the receiver 20 receives the same tuples of bits.

The likelihoods of the tuple of the systematic bit and the first parity bit, which are inputted to the turbo decoding unit 350, are further inputted to the MAP 1 (302). The systematic bit and the first parity bit corresponding to the systematic bit are organized into the tuple and can be therefore inputted as a bit aggregation to the MAP 1 (302). The MAP 1 (302) calculates likelihoods of the decoded results about the systematic bit and the first parity bit corresponding to the systematic bit, and outputs the calculated likelihoods.

The conventional turbo decoding system on the single basis was incapable of inputting the systematic bits and the parity bits as the bit aggregations to the MAP 1 because the systematic bits and the parity bits corresponding thereto exist in the different symbols.

Further, the likelihoods of the tuple of the systematic bit and the first parity bit, which are inputted to the turbo decoding unit 350, are further inputted to the systematic bit component extracting unit 326. The systematic bit component extracting unit 326 extracts the likelihood related to the systematic bit from the likelihoods of the tuple of the systematic bit and the first parity bit, and outputs the extracted likelihood.

An adder 314 subtracts the likelihood (the output of the systematic bit component extracting unit 326) related to the systematic bit from the output of the MAP 1 (302). This is because the output of the MAP 1 (302) contains influence of the systematic bit inputted to the MAP 1 (302), and consequently this influence is to be eliminated.

A result made by the adder 314 is inputted to and interleaved by the interleaver 322. Interleaving is conducted on a bit-by-bit basis. The two systematic bits are not mapped to the same symbol, and hence the interleaving can be performed on the bit-by-bit basis. The interleaved signal is inputted to the MAP 2 (304).

Moreover, the likelihoods of the tuple of the second parity bits inputted to the turbo decoding unit 350 are inputted intact as the tuple of likelihoods to the MAP 2 (304). The MAP 2 (304) calculates the likelihoods of the decoded results about the systematic bit (the signal corresponding to the systematic bit interleaved by the interleaver 322) and the second parity bit corresponding to the systematic bit, and outputs the calculated likelihoods.

An adder 312 subtracts the likelihood of the systematic bit inputted to the MAP 2 (304) from the output of the MAP 2 (304). This is because the output of the MAP 2 (304) contains the influence of the likelihood inputted to the MAP 2 (304), and consequently this influence is to be eliminated.

An output of the adder 312 is inputted to and deinterleaved by the deinterleaver 324. The deinterleaved signal is fed back and synthesized with the signal inputted to the MAP 1 for the first time, and the synthesized signal is inputted again to the MAP 1 (302).

Hereafter, the decoding operation is repeated a predetermined number of times, thereby obtaining the output with an error rate reduced.

(Likelihood Calculating Method)

Figure 9:
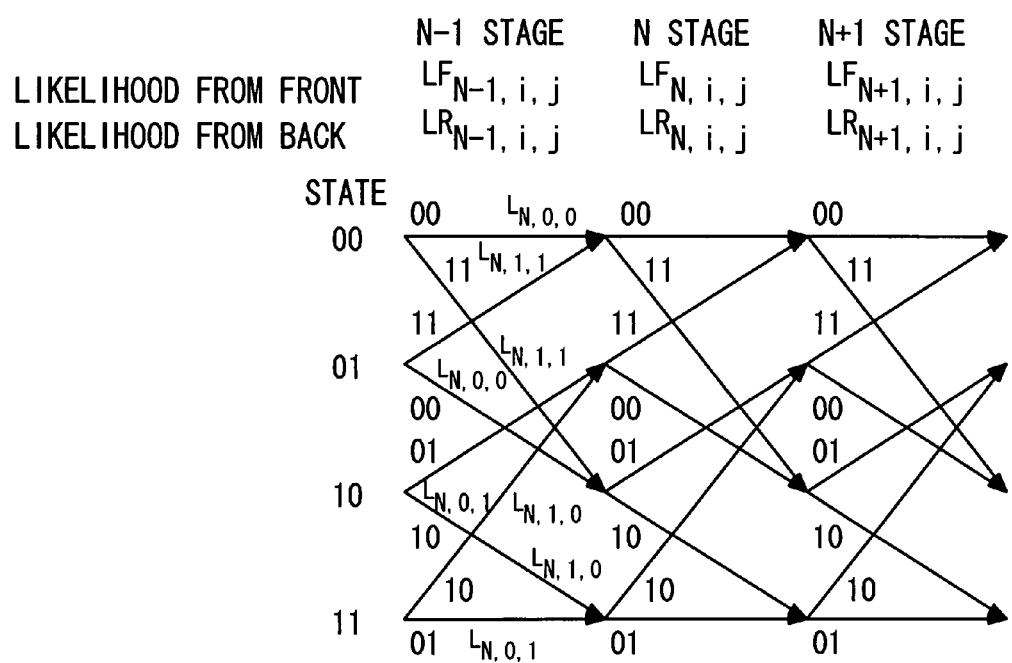
FIG. 9 is a diagram showing a process of MAP.

FIG. 9 is a diagram showing a method of calculating the likelihood in the MAP (MAP unit).

Each arrow in FIG. 9 represents a transition of a state in coding. Two arrows extend from each state. This implies that the transitions from each state to two states can be made. Further, a relatively upper arrow of the two arrows indicates a case where the input is 0, while a relatively lower arrow indicates a case where the input is 1. Moreover, a 2-digit numeral affixed to the arrow indicates an output when the digit is inputted. For example, if in a state "00" and when 0 is inputted, the output is "00", and a next state is the state "00". Alternatively, if in the state "00" and when "1" is inputted, the output is "11", and the next state is a state "10".

Further, it is understood that conversely if the present state is the state "00" and when a just-anterior output is "11", a just-anterior state is a state "01", and the input is "0".

The MAP 1 (302) obtains the log likelihoods up to an N stage by adding the log likelihoods of the tuple of the systematic bit and the first parity bit to the log likelihoods up to an N−1 stage from the front. For example, when the state of the N stage is "00", the likelihood from the front is expressed as follows.

$$LF_{N,0,0} = \log_e(\exp[LF_{N,0,0}(0)] + \exp[LF_{N,0,0}(1)])$$ [Mathematical Expression 5]

Herein, $LF_{N,0,0}(0)$, $LF_{N,0,0}(1)$ are defined as below.

$$LF_{N,0,0}(0) = LF_{N-1,0,0} + L_{N,0,0}$$

$$LF_{N,0,0}(1) = LF_{N-1,0,1} + L_{N,1,1}$$ [Mathematical Expression 6]

Herein, $L_{N,i,j}$ is a likelihood at which the reception signal (the systematic bit and the first parity bit) can take (i, j).

Further, the log likelihoods up to the N stage from the back are obtained by adding the log likelihood of the tuple of the systematic bit and the first parity bit to the log likelihoods up to the N+1 stage from the back. For example, when the state of the N stage is "00", the likelihood from the back is expressed as follows.

$$LR_{N,0,0} = \log_e(\exp[LR_{N+1,0,0} + L_{N+1,0,0}] + \exp[LR_{N+1,1,0} + L_{N+1,1,1}])$$ [Mathematical Expression 7]

The log likelihoods from the front are synthesized with the log likelihoods from the back, and thus the likelihood of the bit (the systematic bit) of the N stage is calculated and then obtained as follows.

$$L_N = \log_e \left( \frac{\exp\left[\sum_{i=0}^{1}\sum_{j=0}^{1} LF_{N,i,j}(0) + LR_{N,i,j}\right]}{\exp\left[\sum_{i=0}^{1}\sum_{j=0}^{1} LF_{N,i,j}(1) + LR_{N,i,j}\right]} \right)$$ [Mathematical Expression 8]

Whether the value at the N stage is "0" or "1" is recognized from positive and negative of the thus-obtained likelihood $L_N$.

(Turbo Decoding 1)

Figure 10:
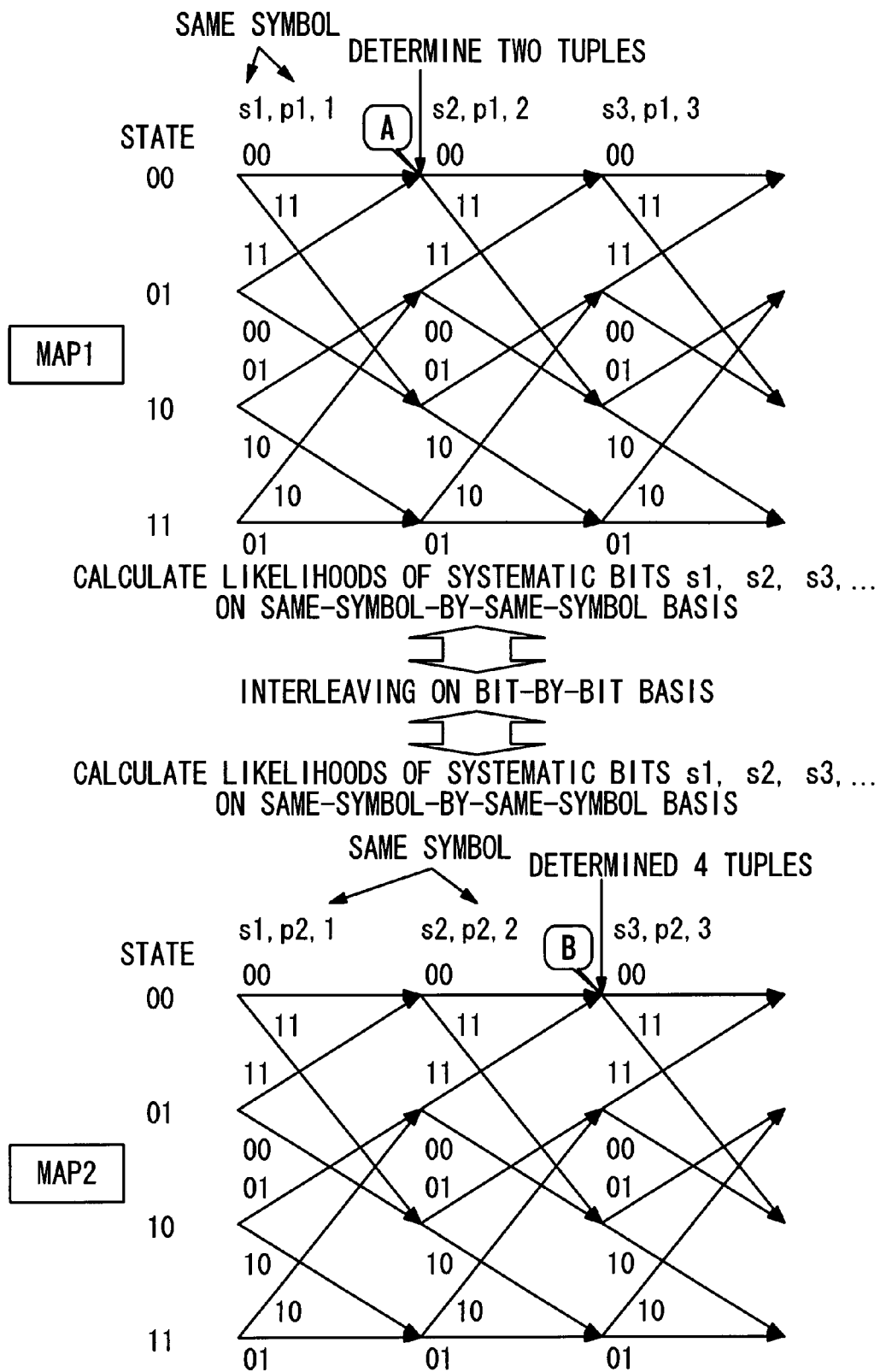
FIG. 10 is a diagram showing an example (Turbo Decoding 1) of turbo decoding in which the systematic bit and the parity bit are mapped to the same symbol.

FIG. 10 is a diagram showing an example of the turbo decoding, wherein the systematic bit and the parity bit are mapped to the same symbol. An upper part in FIG. 10 illustrates a process by the MAP 1 (302), while a lower part illustrates a process by the MAP 2 (304).

The systematic bit and the first parity bit are inputted to the MAP 1 (302). The systematic bit and the first parity bit corresponding thereto are mapped to the same symbol. Therefore, the systematic bit is mapped to none of the same symbols as those to which other systematic bits are mapped.

Accordingly, a systematic bit s1 and a systematic bit s2 are mapped to different symbols, thereby enabling the process to be executed independently. For example, at [A] in FIG. 10, determining targets may be only two ways of tuples of the just-anterior outputs "00" and "11" that transit to the state "00".

On the other hand, the systematic bit and the second parity bit are inputted to the MAP 2 (304). The second parity bit corresponding to the systematic bit is not mapped to the same symbol. Further, the second parity bits are mapped as a 2-bit aggregation to the 16-QAM signal. Therefore, the likelihoods are processed on a 2-bit aggregation basis. The arithmetic operation in the MAP 2 (304) is updated on a 2-stage-by-2-stage basis, and the determination is made from 4 ways of tuples. For example, at [B] in FIG. 10, the 4 ways of tuples of the just-anterior outputs 0000, 1100, 0111 and 1011 that transit to the state "00", need becoming the determining targets. This is because the second parity bits p2, 1 and p2, 2 exist in the same symbols.

If the MAP process is done with the tuples of the systematic bits and the first parity bits, it is sufficient to compare and store the 2-ways of tuples. The MAP process with the tuples of the systematic bits and the second parity bits involves comparing and storing the 4-ways of tuples.

Note that in the case of 256-QAM, the MAP 1 executes the process by every two systematic bits. This is because one symbol contains the two systematic bits. Further, the MAP 2, because of the four pieces of second parity bits being mapped to the one symbol, executes the process by every 4 systematic bits. Moreover, the interleaving is conducted on these units. The conventional turbo coding on the 256-QAM symbol basis involves executing the process by every 4 systematic bits in both of the MAPs, resulting in an increase in memory usage quantity. The present embodiment enables the memory usage quantity to be reduced due to a less quantity of bits processed at one time than by the prior art.

(Turbo Decoding 2)

Next, a modified example of the turbo decoding will be shown. Different points from the (Turbo Decoding 1) described above will be explained.

Figure 11:
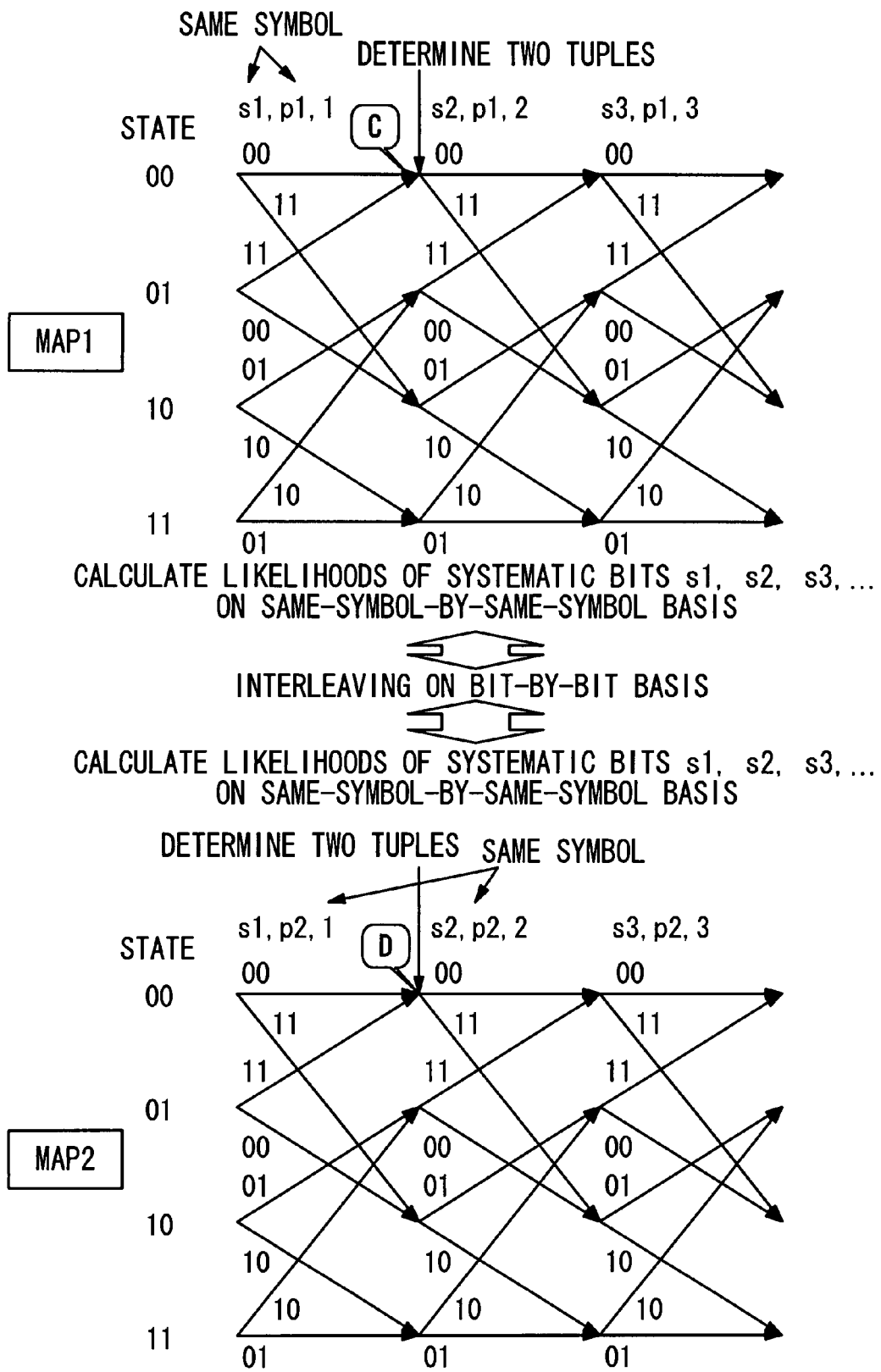
FIG. 11 is a diagram showing an example (Turbo Decoding 2) of the turbo decoding in which the systematic bit and the parity bit are mapped to the same symbol.

FIG. 11 is a diagram showing an example of the turbo decoding in which the systematic bit and the parity bit are mapped to the same symbol. An upper part in FIG. 11 illustrates the process by the MAP 1 (302), while a lower part illustrates the process by the MAP 2 (304).

The systematic bits and the second parity bits are inputted to the MAP 2 (304). The second parity bits mapped on the 2-bit-by-2-bit basis to the same symbol. The parity bits are, before being inputted to the MAP 2 (304), divided into bit-by-bit likelihoods. The bit-by-bit likelihoods of the second parity bits are calculated by the likelihood calculating unit 366. With this scheme, in the same way as by the MAP 1, the 2-ways of tuples can be set as the determining targets.

Note that in the case of the 256-QAM, the MAP 1 processes the bits by every two systematic bits. This is because one symbol contains the two systematic bits. Further, in the MAP 2 also, the four pieces of second parity bits are mapped to one symbol. The second parity bits are, before being inputted to the MAP 2 (304), divided into likelihoods on an every two second parity bits basis, corresponding to the previous two systematic bits. The likelihoods on the every two second parity bits basis are calculated by the likelihood calculating unit 366. Moreover, the interleaving is conducted on these units. With this scheme, in the MAP 2 also, in the same way as by the MAP 1, the 4 ways of tuples can be set as the determining targets. The conventional turbo coding on the 256-QAM symbol basis involves executing the process by every 4 systematic bits in both of the MAPs, resulting in the increase in memory usage quantity. The present embodiment enables the memory usage quantity to be reduced due to a less quantity of bits processed at one time than by the prior art.

Effect in Present Embodiment

Figure 12:
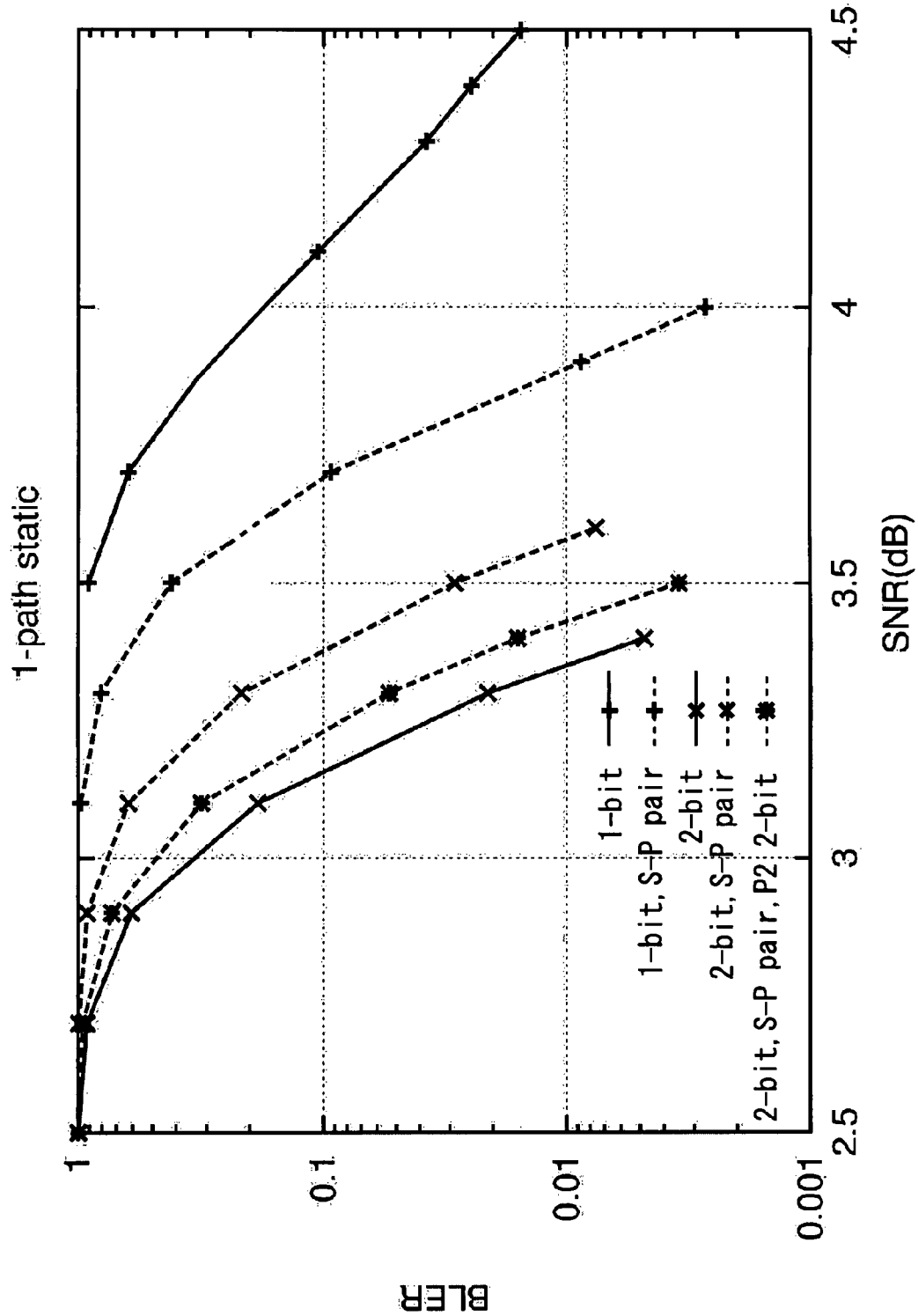
FIG. 12 is a diagram showing a characteristic example of the turbo decoding according to an embodiment.
Figure 14:
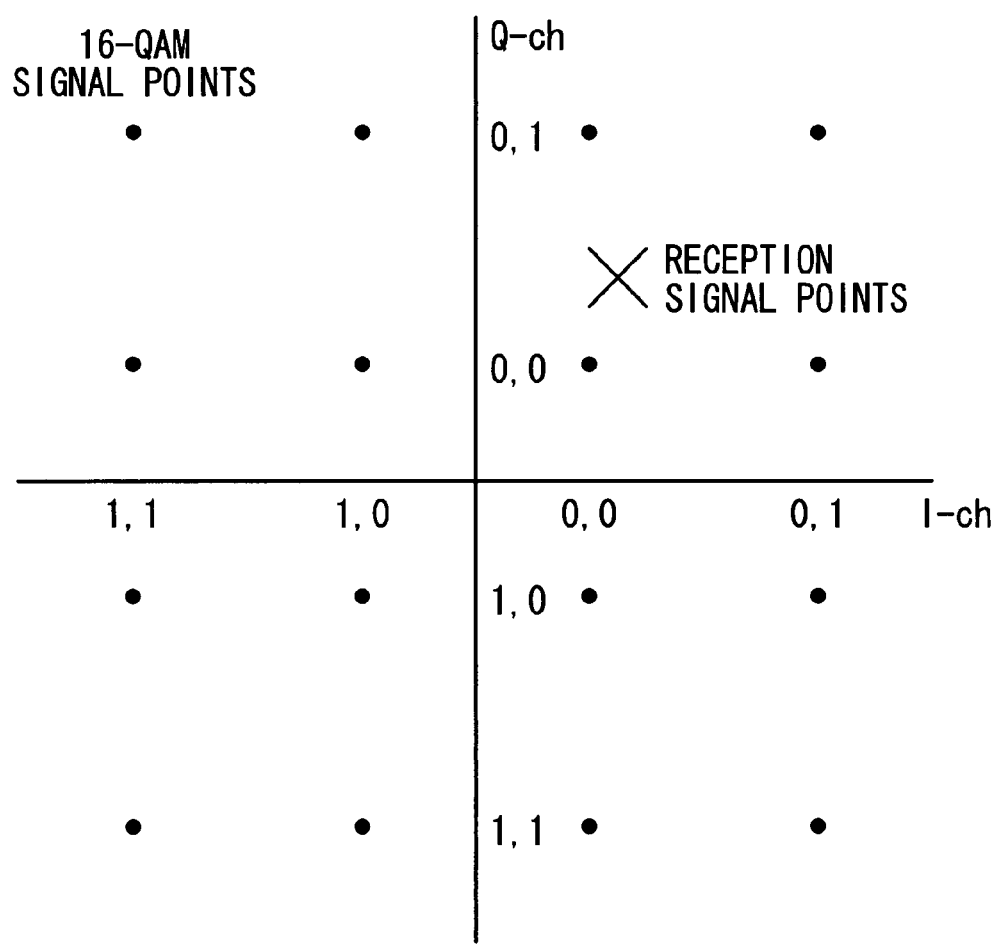
FIG. 14 is a diagram showing how signal points in 16-QAM are allocated and where reception signal points exist.
Figure 15:
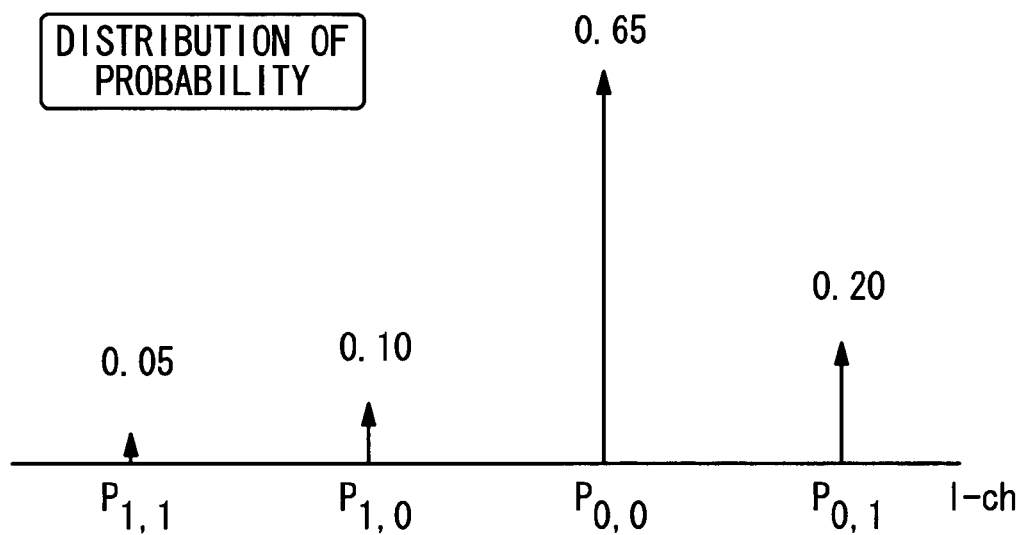
FIG. 15 is a diagram showing a probability of each signal point with respect to the reception signal.
Figure 17:
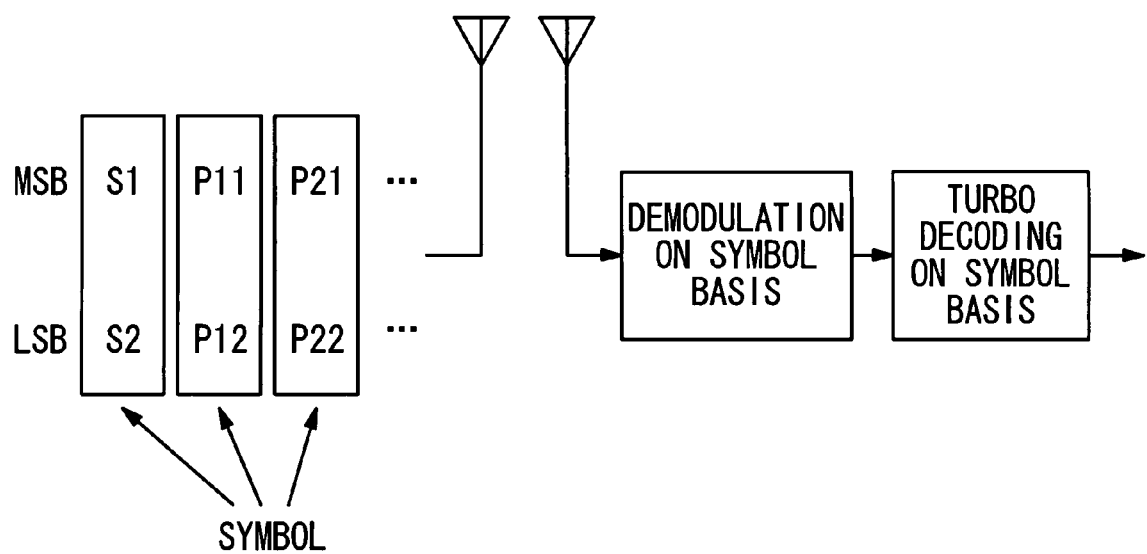
FIG. 17 is a diagram showing a conventional example of mapping to 16-QAM in the case of using turbo coding on a symbol basis.
Figure 18:
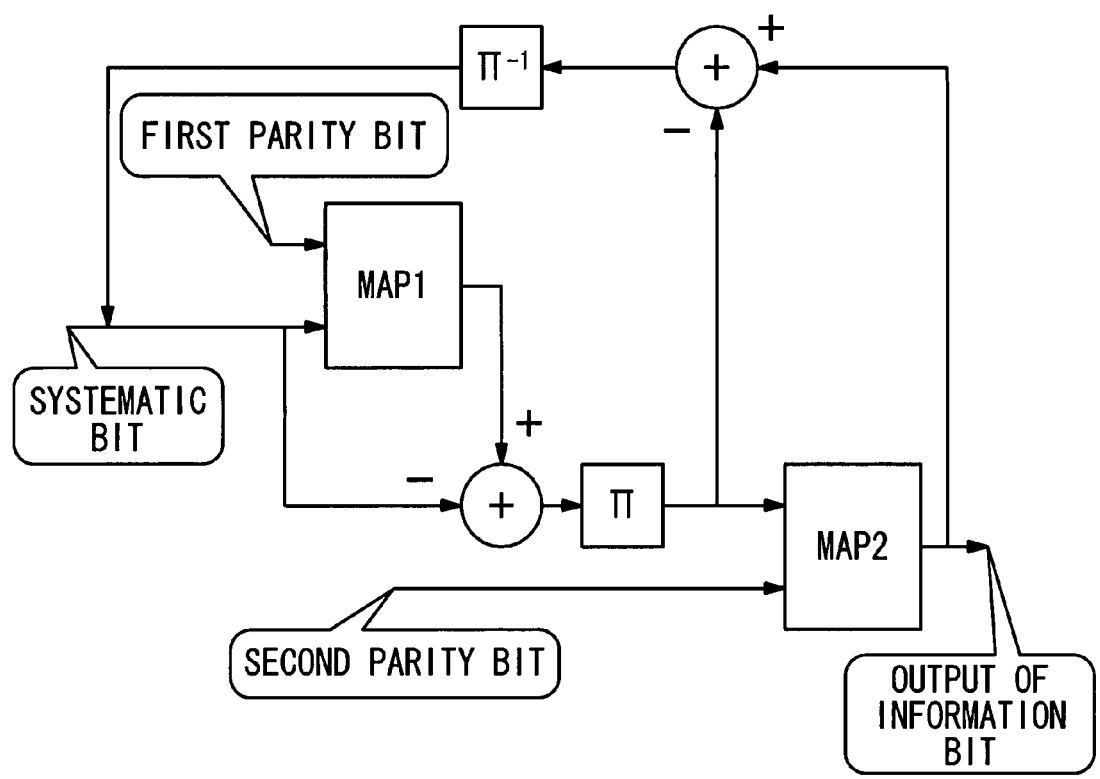
FIG. 18 is a diagram showing an example of the conventional turbo decoding.
Figure 19:
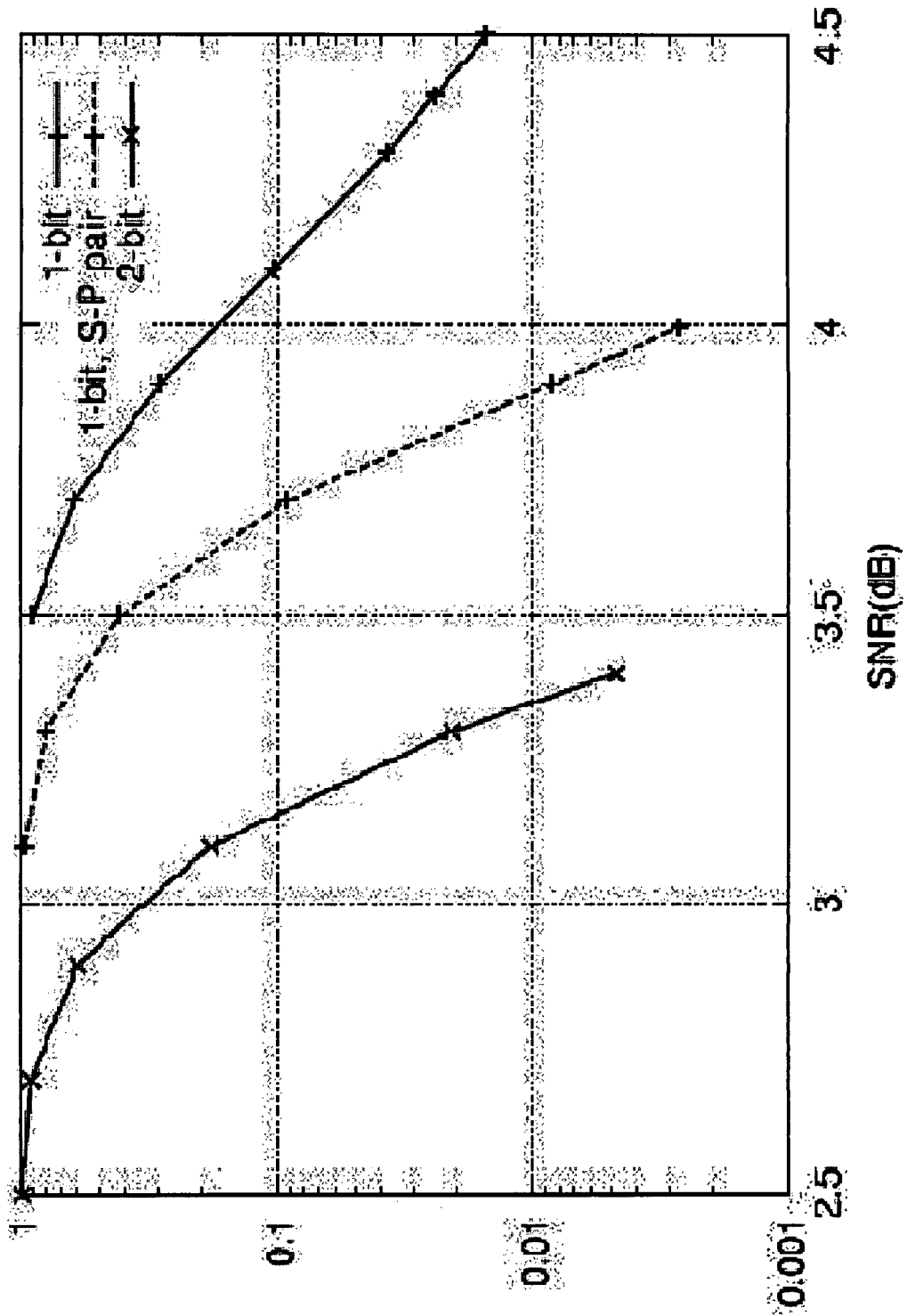
FIG. 19 is a diagram showing characteristic examples of the turbo coding on the symbol basis and the turbo coding on the bit basis.

FIG. 12 is a diagram illustrating characteristics in the present embodiment. In FIG. 12, the axis of abscissa represents an SN ratio (SNR; Signal-to-Noise Ratio), and the axis of ordinate represents BLER (Block Error Rate). FIG. 12 shows characteristic graphs in a case where while keeping a correlation between the systematic bit and the first parity bit, the turbo coding is conducted on the bit basis and on the symbol basis, and the interleaving is performed on the bit basis (Turbo Decoding 1, FIG. 12: 2-bit, S-P pair, P2, 2-bit), and in a case where while keeping the correlation between the systematic bit and the first parity bit, the symbols of the second parity bits are divided, the turbo coding is carried out on the bit basis, and the interleaving is performed on the bit basis (Turbo Decoding 2, FIG. 12, 2-bit, S-P pair). Other three graphs are the same as those in FIG. 19.

The Turbo Decoding 1 and the Turbo Decoding 2 in the present embodiment improve the characteristics as compared with the turbo coding on the bit basis. As compared with the turbo coding on the symbol basis, however, the improvement slightly goes down.

FIG. 13 is a table that sorts out the effects in the present embodiment. The conventional turbo coding on the bit basis, the conventional turbo coding on the symbol basis, the Turbo Decoding 1 according to the present embodiment, and the Turbo Decoding 2 according to the present embodiment are compared with each other in terms of the characteristics and throughputs.

The compared characteristics are those when BLER=0.1. The reference is set to the conventional turbo coding on the bit basis. The conventional turbo coding on the symbol basis shows an improvement of 0.5 dB. The Turbo Decoding 1 in the present embodiment shows an improvement of 0.4 dB. The Turbo Decoding 2 in the present embodiment shows an improvement of 0.5 dB.

Figure 20:
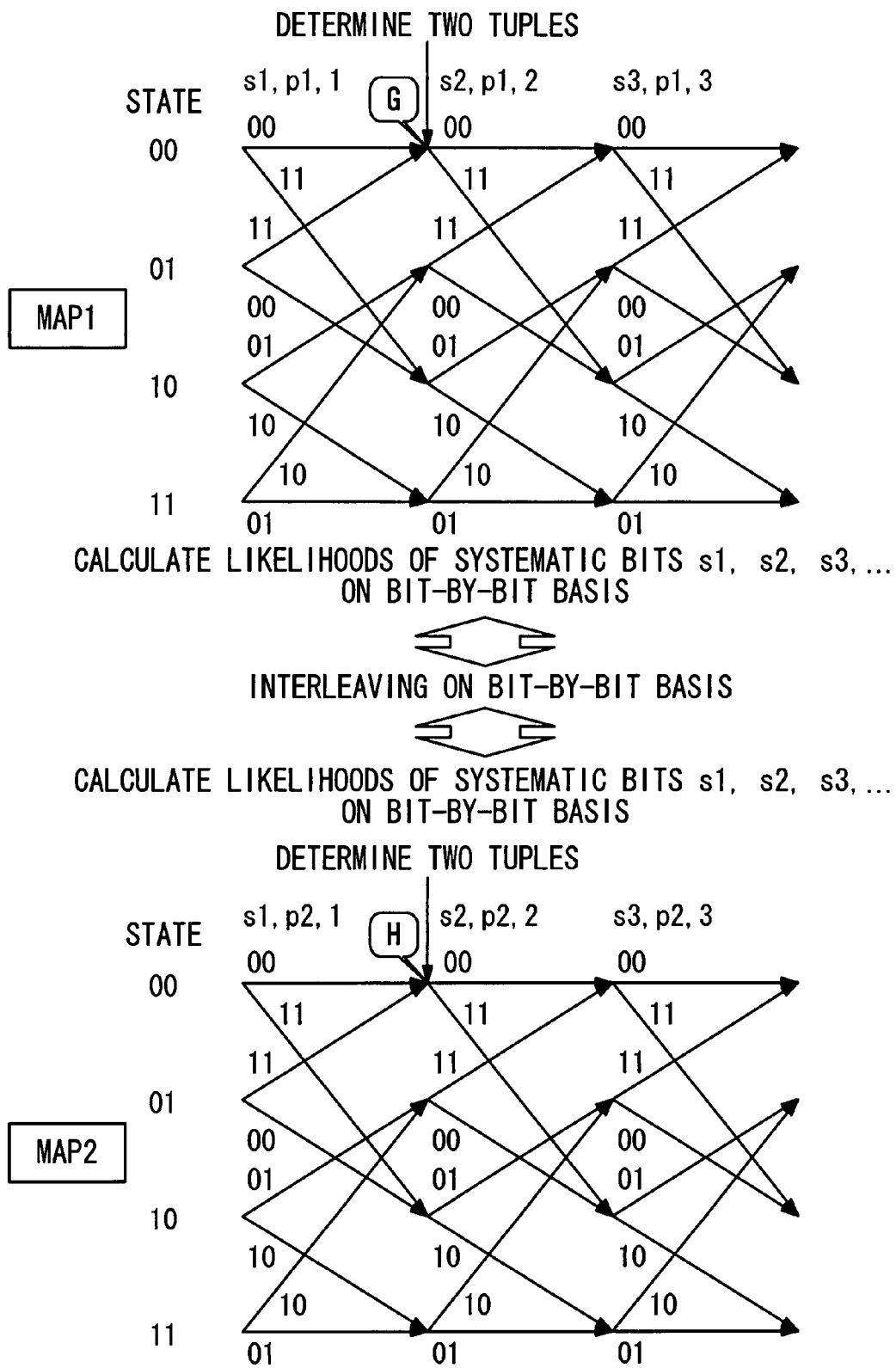
FIG. 20 is a diagram showing an example of the turbo decoding on the bit basis.
Figure 21:
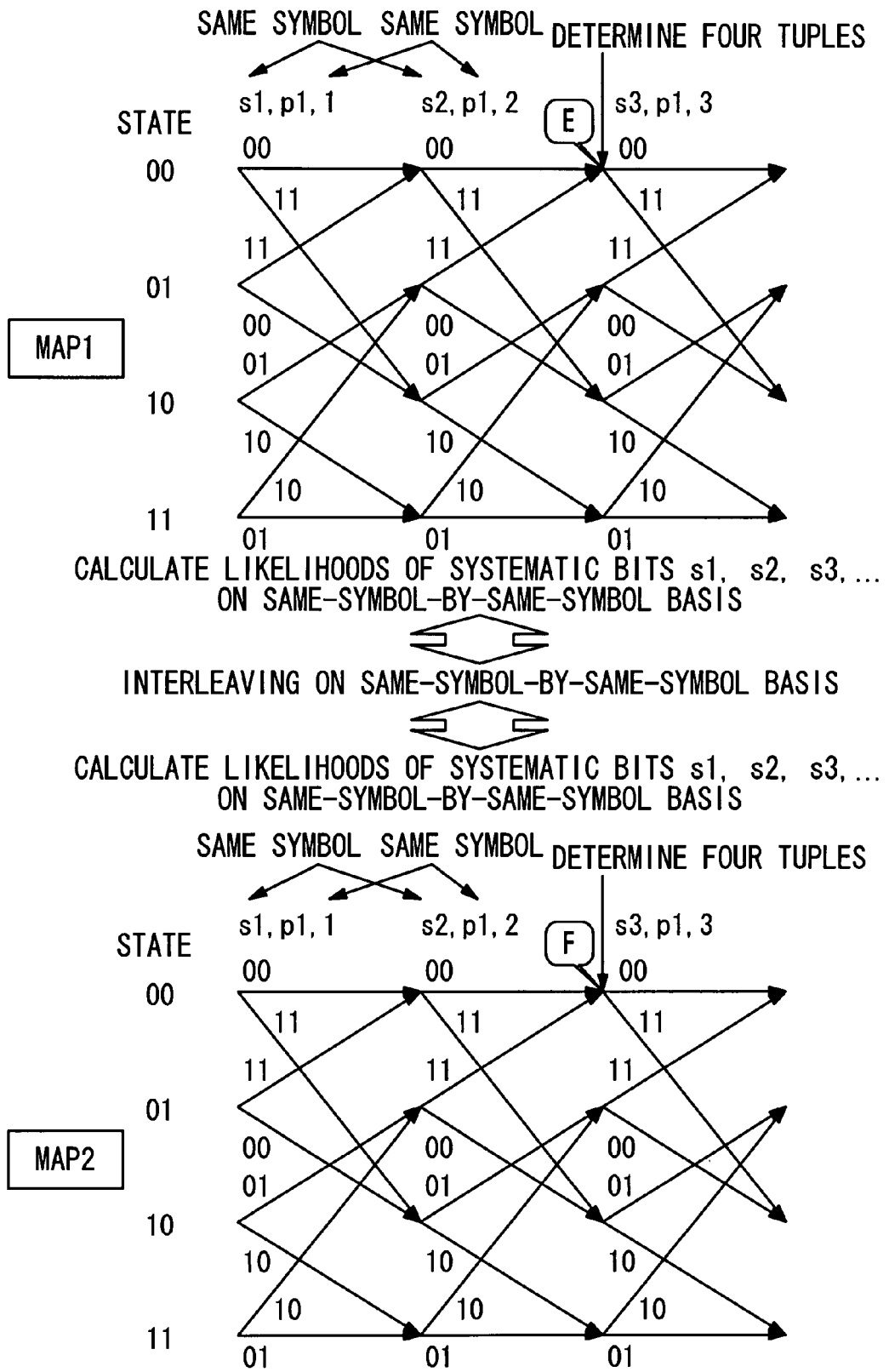
FIG. 21 is a diagram showing an example of the conventional turbo decoding on the symbol basis.
Figure 22:
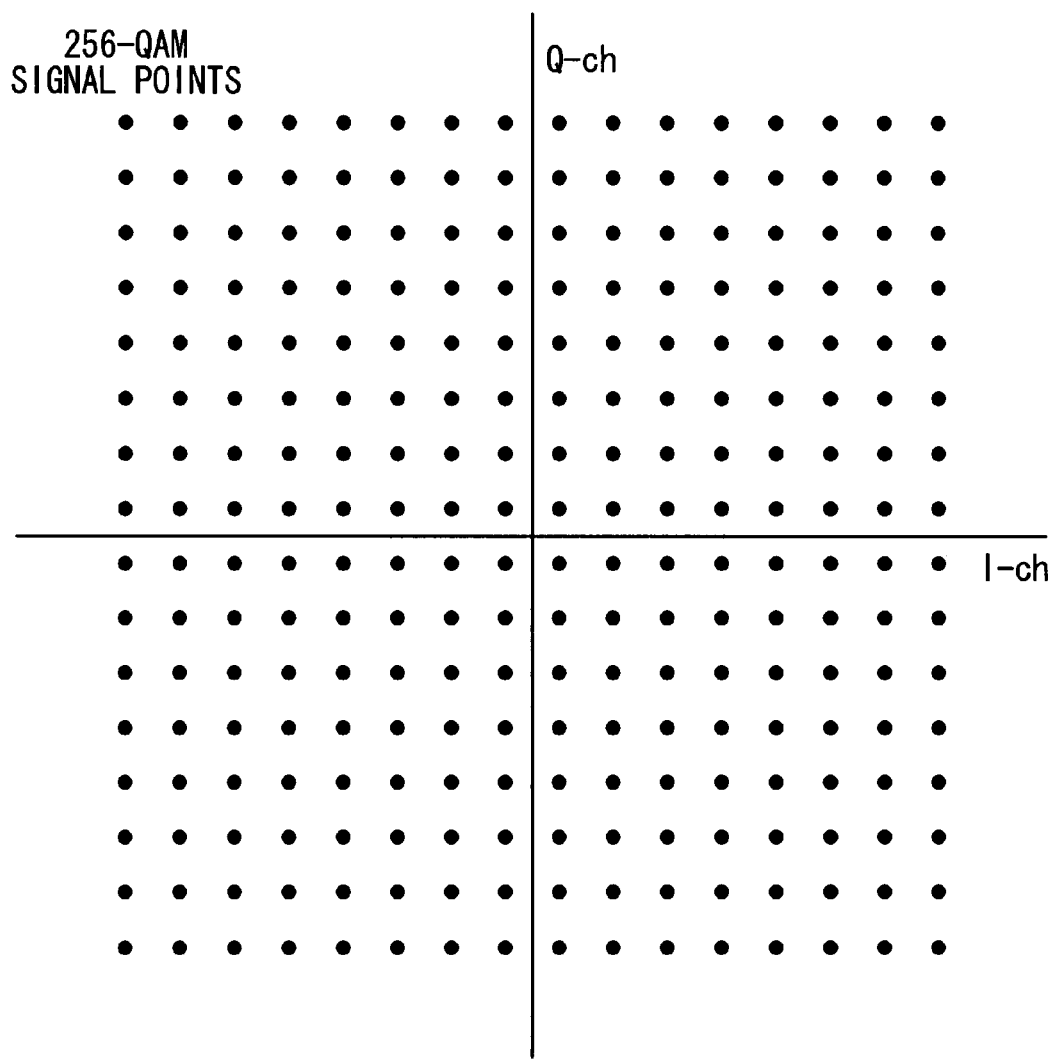
FIG. 22 is a diagram showing where the signal points of 256-QAM exist.

The throughput represents a ratio of number in the case of processing at one time by the MAP. For example, in the turbo coding on the bit basis in FIG. 20, the determining targets are 2-ways of tuples at [G] and 2-ways of tuples at [H] in FIG. 20. Further, in the turbo coding on the symbol basis in FIG. 21, the determining targets are 4-ways of tuples at [E] and 4-ways of tuples at [F] in FIG. 21. Namely, the throughput is doubled as compared with the turbo coding on the bit basis. This implies a necessity for a 2-fold memory.

On the other hand, an example of the Turbo Decoding 1 in FIG. 10 is that the determining targets are the 2-ways of tuples at [A] and the 4-ways of tuples at [B] in FIG. 10. This implies a necessity for a 1.5-fold memory usage quantity as compared with the turbo coding on the bit basis. Moreover, an example of the Turbo Decoding 2 in FIG. 11 is that the determining targets are the 2-ways of tuples at [C] and the 2-ways of tuples at [D] in FIG. 11. This implies that the memory usage quantity equal to that of the turbo coding on the bit basis may be sufficient.

According to the present embodiment, the turbo coding having the more acceptable characteristics than by the conventional turbo on the bit basis can be realized with the less memory usage quantity than by the conventional turbo coding on the symbol basis.

What is claimed is:

1. A decoding device to which 2 tuples of systematic bits and first redundant bits corresponding to the systematic bits and a tuple of second redundant bits corresponding to the respective systematic bits of the 2 tuples of bits, are inputted, the decoding device comprising:
   a calculating unit calculating a likelihood on a tuple-by-tuple basis;
   a first decoding unit performing decoding for every one systematic bit by use of a likelihood of a tuple of the systematic bit and a first redundant bit corresponding to the systematic bit; and
   a second decoding unit performing decoding for every two systematic bits by use of a likelihood of the systematic bit which is output by the first decoding unit and a likelihood of a tuple of second redundant bits corresponding to the systematic bits.

2. A decoding device to which 2 tuples of systematic bits and first redundant bits corresponding to the systematic bits and a tuple of second redundant bits corresponding to the respective systematic bits of the 2 tuples of bits, are inputted, the decoding device comprising:
   a calculating unit calculating a likelihood on a tuple-by-tuple basis, and a likelihood of the second redundant bit on a bit-by-bit basis;
   a first decoding unit performing decoding for every one systematic bit by use of a likelihood of a tuple of the systematic bit and a first redundant bit corresponding to the systematic bit; and
   a second decoding unit performing decoding for every one systematic bit by use of a likelihood of the systematic bit which is output by the first decoding unit and a likelihood of the second redundant bit on the bit-by-bit basis.

3. A decoding device to which 2 tuples of n-pieces of systematic bits and n-pieces of first redundant bits corresponding to the n-pieces of systematic bits and a tuple of 2n-pieces of second redundant bits corresponding to the systematic bits of the two tuples of bits, are inputted,
   the decoding device comprising:
   a calculating unit calculating a likelihood on a tuple-by-tuple basis;
   a first decoding unit performing decoding for every n-pieces of systematic bits by use of likelihoods of the 2 tuples of n-pieces of systematic bits and the n-pieces of first redundant bits corresponding to the n-pieces of systematic bits; and
   a second decoding unit performing decoding for every 2n-pieces of systematic bits by use of likelihoods of the 2n-pieces of systematic bits which are output by the first decoding unit, and likelihoods of the tuple of 2n-pieces of second redundant bits corresponding to the systematic bits of the 2 tuples of bits.

4. A decoding device to which 2 tuples of n-pieces of systematic bits and n-pieces of first redundant bits corresponding to the n-pieces of systematic bits and a tuple of 2n-pieces of second redundant bits corresponding to the systematic bits of the two tuples of bits, are inputted,
   the decoding device comprising:
   a calculating unit calculating a likelihood on a tuple-by-tuple basis and likelihoods, on an n-bit-by-n-bit basis, of the second redundant bits corresponding to the n-pieces of systematic bits;
   a first decoding unit performing decoding for every n-pieces of systematic bits by use of the likelihoods of the tuple of the systematic bit and the first redundant bit corresponding to the systematic bit; and
   a second decoding unit performing decoding for every n-pieces of systematic bits by use of the likelihood of the systematic bit which is output by the first decoding unit, and the likelihood of the second redundant bit on the bit-by-bit basis.

5. A receiver, receiving and demodulating a symbol consisting of a plurality of bits in a multivalued modulation system, to which 2 symbols consisting of systematic bits and first redundant bits corresponding to the systematic bits and a symbol consisting of second redundant bits corresponding to the respective systematic bits of the 2 symbols, are inputted, the receiver comprising:
   a decoding processing unit including:
   a calculating unit calculating a likelihood on a symbol-by-symbol basis;
   a first decoding unit performing decoding for every one systematic bit by use of a likelihood of a symbol consisting of the systematic bit and a first redundant bit corresponding to the systematic bit; and
   a second decoding unit performing decoding for every two systematic bits by use of a likelihood of the systematic bit which is output by the first decoding unit and a likelihood of a symbol consisting of second redundant bits corresponding to the systematic bits.

6. A receiver, receiving and demodulating a symbol consisting of a plurality of bits in a multivalued modulation system, to which 2 symbols consisting of systematic bits and first redundant bits corresponding to the systematic bits and a symbol consisting of second redundant bits corresponding to the respective systematic bits of the 2 symbols, are inputted, the receiver comprising:
   a decoding processing unit including:
   a calculating unit calculating a likelihood on a symbol-by-symbol basis, and a likelihood of the second redundant bit on a bit-by-bit basis;
   a first decoding unit performing decoding for every one systematic bit by use of a likelihood of a symbol consisting of the systematic bit and a first redundant bit corresponding to the systematic bit; and
   a second decoding unit performing decoding for every one systematic bit by use of a likelihood of the systematic bit which is output by the first decoding unit and a likelihood of the second redundant bit on the bit-by-bit basis.

7. A receiver, receiving and demodulating a symbol consisting of a plurality of bits in a multivalued modulation system, to which 2 symbols consisting of n-pieces of systematic bits and n-pieces of first redundant bits corresponding to the n-pieces of systematic bits and a symbol consisting of 2n-pieces of second redundant bits corresponding to the respective systematic bits of the 2 symbols, are inputted, the receiver comprising:
   a decoding processing unit including:
   a calculating unit calculating a likelihood on a symbol-by-symbol basis;
   a first decoding unit performing decoding for every n-pieces of systematic bits by use of likelihoods of the 2 symbols consisting of the n-pieces of systematic bits and the n-pieces of first redundant bits corresponding to the n-pieces of systematic bits; and
   a second decoding unit performing decoding for every 2n-pieces of systematic bits by use of likelihoods of the n-pieces of systematic bits which are output by the first decoding unit and a likelihood of the symbol consisting of the 2n-pieces of second redundant bits corresponding to the respective systematic bits of the 2 symbols.

8. A receiver, receiving and demodulating a symbol consisting of a plurality of bits in a multivalued modulation system, to which 2 symbols consisting of n-pieces of systematic bits and n-pieces of first redundant bits corresponding to the n-pieces of systematic bits and a symbol consisting of 2n-pieces of second redundant bits corresponding to the respective systematic bits of the 2 symbols, are inputted, the receiver comprising:
  a decoding processing unit including:
    a calculating unit calculating a likelihood on a symbol-by-symbol basis and likelihoods, on an n-bit-by-n-bit basis, of the second redundant bits corresponding to the n-pieces of systematic bits;
    a first decoding unit performing decoding for every n-pieces of systematic bits by use of the likelihoods of the symbol consisting of the systematic bit and the first redundant bit corresponding to the systematic bit; and a second decoding unit performing decoding for every n-pieces of systematic bits by use of the likelihood of the systematic bit which is output by the first decoding unit, and the likelihood of the second redundant bit on the bit-by-bit basis.

* * * * *